United States Patent
Lee

(10) Patent No.: US 10,168,404 B2
(45) Date of Patent: Jan. 1, 2019

(54) METHOD AND MAGNETIC RESONANCE APPARATUS FOR ESTABLISHING A RESONANT FREQUENCY

(71) Applicant: Siemens Aktiengesellschaft, Munich (DE)

(72) Inventor: Kuan Jin Lee, Singapore (SG)

(73) Assignee: Siemens Aktiengesellschaft, Munich (DE)

( * ) Notice: Subject to any disclaimer, the term of this patent is extended or adjusted under 35 U.S.C. 154(b) by 668 days.

(21) Appl. No.: 14/694,125

(22) Filed: Apr. 23, 2015

(65) Prior Publication Data
US 2015/0309138 A1 Oct. 29, 2015

(30) Foreign Application Priority Data
Apr. 23, 2014 (DE) .................. 10 2014 207 639

(51) Int. Cl.
| | |
|---|---|
| *G01R 33/48* | (2006.01) |
| *G01R 33/56* | (2006.01) |
| *G01R 33/34* | (2006.01) |
| *G01R 33/30* | (2006.01) |
| *G01R 33/58* | (2006.01) |
| *G01R 33/561* | (2006.01) |

(52) U.S. Cl.
CPC ......... *G01R 33/4828* (2013.01); *G01R 33/30* (2013.01); *G01R 33/34* (2013.01); *G01R 33/5608* (2013.01); *G01R 33/58* (2013.01); *G01R 33/5607* (2013.01); *G01R 33/5614* (2013.01)

(58) Field of Classification Search
CPC .... G01R 33/4828; G01R 33/58; G01R 33/30; G01R 33/5608; G01R 33/34; G01R 33/5614; G01R 33/5607
See application file for complete search history.

(56) References Cited

U.S. PATENT DOCUMENTS

| | | | |
|---|---|---|---|
| 5,065,334 A | 11/1991 | Taylor et al. | |
| 5,261,405 A * | 11/1993 | Fossel | G01R 33/465 324/312 |
| 5,309,102 A | 5/1994 | Deckard | |
| 9,753,109 B2 * | 9/2017 | Eggers | G01R 33/4828 |
| 2009/0012387 A1 * | 1/2009 | Hanson | A61B 5/055 600/411 |
| 2012/0119740 A1 * | 5/2012 | Takahashi | A61B 5/055 324/309 |
| 2013/0088231 A1 | 4/2013 | Oliveira et al. | |
| 2013/0249552 A1 | 9/2013 | Imamura | |

OTHER PUBLICATIONS

Serban, "MICE: Multiple-Peak Identification, Characterization, and Estimation," Biometrics, vol. 63, pp. 531-539, (2007).

* cited by examiner

*Primary Examiner* — Dixomara Vargas
*Assistant Examiner* — Zannatul Ferdous
(74) *Attorney, Agent, or Firm* — Schiff Hardin LLP

(57) ABSTRACT

In a method and magnetic resonance apparatus for automated establishing of the resonant frequency or resonant frequencies, especially of protons for magnetic resonance experiments, at least one signal, especially an FID is acquired and Fourier transformed to a spectrum. The number of resonance peaks of the spectrum is determined and the resonant frequency or resonant frequencies are established dependent on the number of peaks.

13 Claims, 3 Drawing Sheets

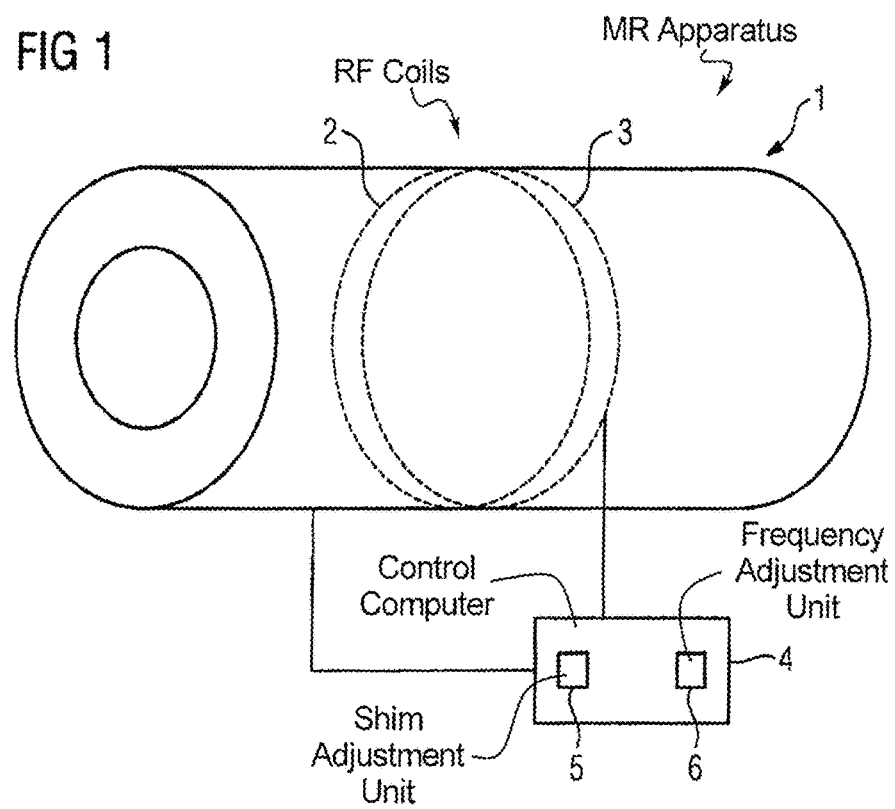
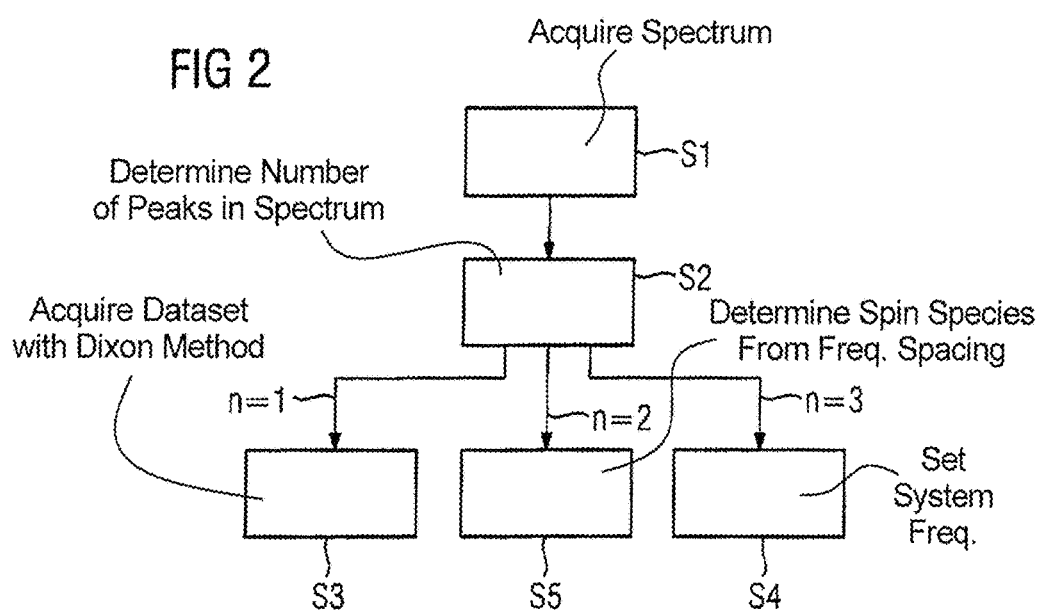

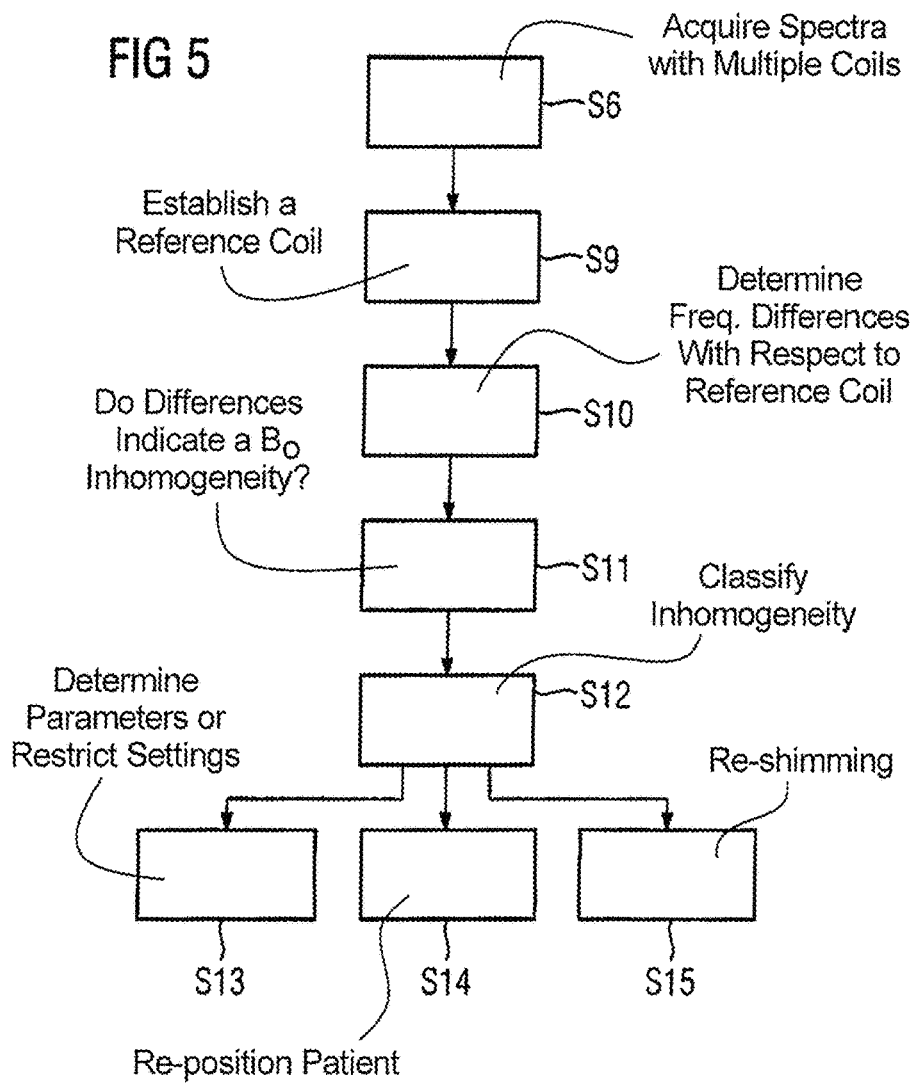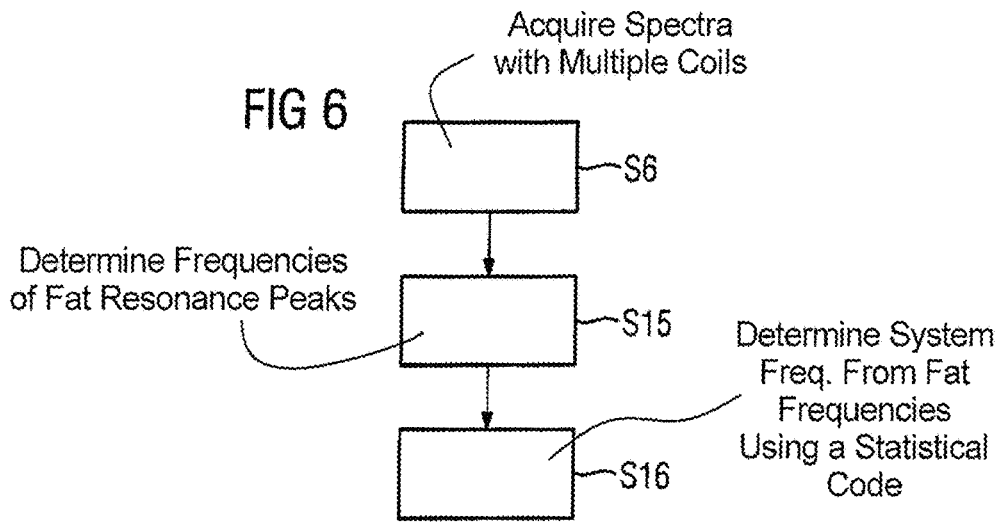

METHOD AND MAGNETIC RESONANCE APPARATUS FOR ESTABLISHING A RESONANT FREQUENCY

BACKGROUND OF THE INVENTION

Field of the Invention

The present invention concerns a method for establishing a resonant frequency for the operation of a magnetic resonance apparatus in order to acquire magnetic resonance data, as well as a magnetic resonance apparatus that operates according to such a method.

Description of the Prior Art

In magnetic resonance examinations, a resonant frequency dependent on the nuclear spin from which signals are to be obtained, energy at the Larmor frequency is radiated into the examination object. Although the resonant frequency is approximately known, the SNR falls very rapidly with increasing distance from the resonant frequency. Since the resonant frequency also depends on the examination object, it has to be re-determined for each change of the examination object or during changes in position of the examination object.

If a spin is located in different chemical environments, as a result of what is known as the chemical shift effect, a number of resonant frequencies can exist. With protons there are at least three distinguishable resonances for protons in water, silicon and fat. The spacing of the resonant frequencies is given by:

$$\delta = (\nu_{SS} - \nu_{Ref})/\nu_{Ref}$$

This is specified in ppm and is therefore independent of the field strength $B_0$ of the magnetic field.

For hydrogen spins, i.e. protons, the resonant frequency at 1.5 T is approximately 63.5 MHz. At this field strength the spacing of the resonant frequency of fat protons to that of water protons amounts to 225 Hz or field-strength-independent 3.5 ppm, silicon protons have a spacing of 5.0 ppm and at 1.5 T thus of 320 Hz. Spins able to be distinguished in this way are also called spin species. Accordingly $\square_{SS}$ designates the frequency of the respective spin species. A proton signal can thus be obtained in vivo from at least three spin species. In this case distinguishing between in vivo or also in vitro and phantom experiments is important to the extent that basically any given amount of substances are able to be mixed in phantom experiments and thus resonant frequencies are also able to occur.

Before the beginning of an examination, adjustment measurements are carried out for homogenizing the magnetic field in the examination volume, so-called shimming, and for establishing the resonant frequency or resonant frequencies, in order to adapt the transmit frequency of the radio-frequency coils. In such cases a system frequency can be established or specified, from the standpoint of which all other relevant frequencies are seen as fixed. For example, the resonant frequency of water protons can be specified as the system frequency. Then the frequency of the fat or silicon protons, where present, is likewise determined with certain restrictions. But this also means that, if only one resonant peak is present in an adjustment measurement spectrum, the spin species to which the resonant peak belongs must also be determined for a part of experiments, for example experiments with fat suppression. Otherwise, pulses limited in bandwidth are used for frequencies for which no resonant spins are present in the examination object.

It is known that the resonant frequencies can be determined semi-automatically. In such cases a spectrum is acquired and a user is asked whether silicon is present in the examination object. Depending on the user input, model spectra with one or two resonance peaks are selected and a calculation of cross-correlation coefficients of the model spectra with the assumed spectrum is carried out. The cross-correlation coefficient with the highest numerical value gives the best match. In this manner the resonant frequency of the spin species present in the examination object can be established.

Each spin species, as described above, basically has a peak. In such cases the spins designated as fat protons can have a number of peaks, of which one is dominant. When "one" fat peak or resonance signal is referred to below, this formulation does not exclude the presence of further peaks. It means that only one peak is relevant for the inventive method.

A disadvantage of the known method is that a user input is necessary. Not only is this is inconvenient; but also a manual entry is always a source of errors. For example, the user can make a mistake or type the entry incorrectly.

SUMMARY OF THE INVENTION

An object of the present invention is to provide a method for establishing a resonant frequency that is less susceptible to errors.

The basis of the invention is to first determine the number of peaks in the spectrum, and the resonant frequency or resonant frequencies then being established as a function of the number of peaks. Thus a user input is no longer required, and the establishing of the resonant frequencies can be designed especially efficiently in this way.

In this case, for example, a threshold value can be pre-specified or established. Establishing the value can be implemented so that the threshold value is determined as a function of the maximum value of the spectrum. The threshold value can be half or a third or any other fraction of the maximum value. The threshold value is intended to filter out noise signals, so that peaks can be counted easily as individual points at which the threshold value is exceeded.

Preferably, with the number of resonance peaks being one, at least one dataset can be recorded with the known Dixon method. In this method, although the resonant frequency is fixed, it can be defined with the dataset whether a water peak, fat peak or silicon peak is involved. In this method, two image datasets, referred to as one dataset, are recorded with different echo times and added to or subtracted from two overlay images. By comparing these four images a conclusion can be made as to the presence or absence of water or fat.

With the number of resonance peaks being two, the cross-correlation coefficients of model spectra each with two resonance peaks and the measured spectrum and the resonant frequencies can be determined as a function of the cross-correlation coefficients. The resonant frequencies or the spacing of the peaks in the model spectra can be predetermined on the basis of the measured spectrum. After determining the spacing of the resonances as the starting point, this corresponds to the above known method in which the user input is no longer necessary. Preferably, from a number of two resonance peaks, the frequency spacing of the resonance peaks can thus be determined and the resonant frequencies can be established as a function of the frequency spacing.

As an alternative, for the number of resonance peaks being two, the cross-correlation coefficients of model spectra each with two resonance peaks and with at least three different frequency spacings and the resonant frequencies can be determined as a function of the cross-correlation coefficients. Thus, at least three model spectra each with two peaks or model spectra with three different resonance peak spacings can be used. In such cases the frequency spacings of water and fat, water and silicon and also fat and silicon are used. There is thus blind testing for all three combination options which can be produced for two peaks in vivo. The model spectrum with the best cross-correlation coefficients defines the spin species present, wherein the exact resonant frequencies are also determined.

If three peaks are present, a model spectrum with three peaks is used. The right-most peak is the water peak.

At least two coils of a coil array can be used for acquiring at least two signals, especially two FIDs, and the resonant frequencies can be compared, taking into consideration the location of the coils, and the result of the comparison can be included for determining a parameter state. The presence or absence of a silicon implant, such as a breast implant, can be determined as the state. Further conclusions can thus be drawn from the resonant frequencies established. If, for example, the spectra that have been recorded with the lateral coils of a breast coil array show a silicon peak, then evidently one or two breast implants are present. The number is able to be defined from the distribution of the silicon peaks between the coils. Thus not only resonant frequencies can be established but implantation detection can be also performed at the same time.

As an alternative or in addition, the $B_0$ homogenization of the magnetic field can be established as the parameter state. If, in addition, the displacement of the resonant frequencies over the coils is established, in which case it is to be noted whether the spin species changes, the $B_0$ homogenization can be determined. This can be determined as sufficient or not sufficient or with intermediate stages. This can be undertaken, for example, in the form of a classification from 1 to 6 or similar. In a first approach in such cases only frequency changes within a spin species are to be noted. More spin species can also be included in the considerations, but the frequency shift present between the spin species is then to be taken into account.

The determination of parameters or the determination of settings can be restricted as a function of the established $B_0$ homogeneity. For example, the echo time or specific sequences such as TrueFISP can be used as a function of the quality of the $B_0$ homogeneity. With large $B_0$ inhomogeneity, only spin echo sequences are allowed for example.

As an alternative or in addition, the use of specific pulses can be restricted, in particular fat suppression pulses such as SPAIR pulses, i.e. frequency-selective inversion pulses, i.e. 180° pulses can be only allowed for predetermined homogeneity classes.

Depending on the $B_0$ homogeneity determined, further steps can be performed. As one step an instruction for repositioning the examination object or the patient can be output. As an alternative the shimming can be undertaken once again or also with changed start parameters. Especially advantageously the resonant frequencies can be used in the spectra recorded with the different coils in order to determine the start parameters of a shim method, i.e. a method for determining the currents of shim coils. As an alternative, the resonant frequencies in the spectra recorded with the different coils can be used to modify the currents of shim coils.

Preferably the modification of the currents of the shim coils is undertaken such that the deflection of inversion pulses, especially frequency-selective inversion pulses, is optimized, for example, so that the deviation of the deflection angle of an inversion pulse is minimized over the examination area. This is not necessarily the same optimization with which the homogeneity of the $B_0$ field is optimized, since with this the line width is minimized.

As an alternative, at least two coils of a coil array can be used for recording at least two signals, especially two FIDs, and the resonant frequencies can be used in order to determine at least one transmit frequency. Thus the average value of the smallest and the largest resonant frequency of the fat resonance peak of the spectra recorded with the number of coils can be used for an inversion pulse as the transmit frequency. In a further embodiment all resonant frequencies of the fat resonance peaks can be used for forming an average value.

The object underlying the present invention is also achieved by a magnetic resonance apparatus that has at least one radio-frequency coil for radiation of radio-frequency pulses as well as a control computer. The control computer is designed to cause the method as described to be implemented.

The above method can be implemented in the control computer as software and/or as (hard-wired) hardware.

BRIEF DESCRIPTION OF THE DRAWINGS

FIG. 1 shows a magnetic resonance apparatus.

FIG. 2 is a flowchart of a first embodiment of the method according to the invention.

FIG. 5 is a flowchart of a third embodiment of the method according to the invention.

FIG. 6 is a flowchart of a fourth embodiment of the method according to the invention.

DESCRIPTION OF THE PREFERRED EMBODIMENTS

Figure 3:
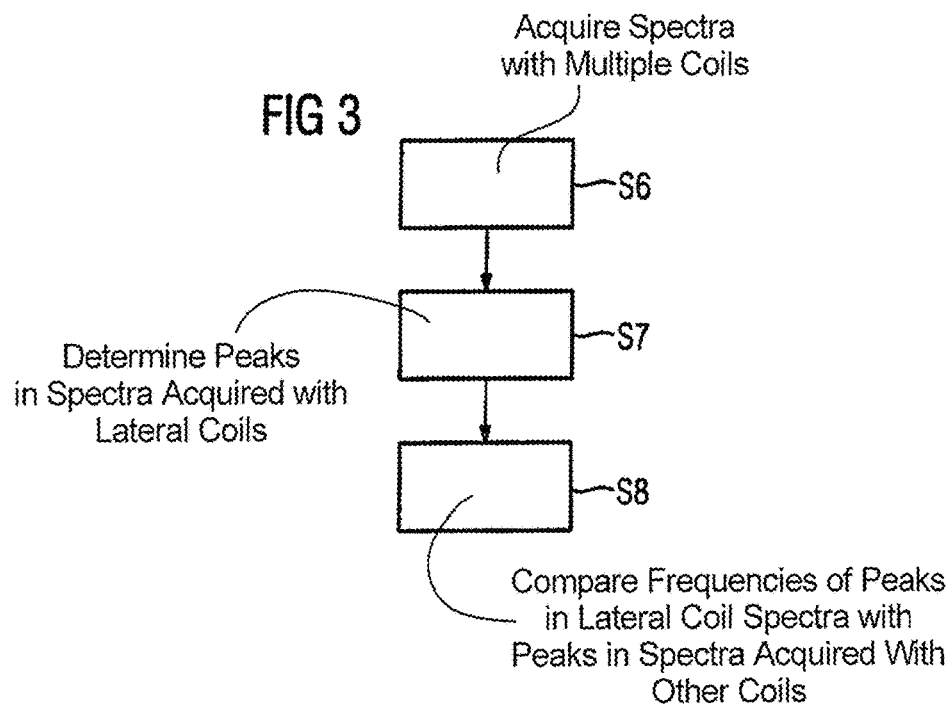
FIG. 3 is a flowchart of a second embodiment of the method according to the invention.

FIG. 1 shows a magnetic resonance (MR) apparatus 1 with at least one radio-frequency coil 2. The radio-frequency (RF) coil 2 can be a transmit and receive coil. However a further radio-frequency coil 3 can also be provided as a receive coil and the radio-frequency coil 2 can be a pure transmit coil. In this case the radio-frequency coil 2 is a so-called body coil and the radio-frequency coil 3 is a coil adapted to the examination area, such as a breast coil. Coil in this context also means a coil array, in particular the radio-frequency coil 3 can thus be embodied as a receive coil array. The magnetic resonance apparatus 1 also includes a control computer 4. Present in the control computer 4 are a shim adjustment unit 5 and a frequency adjustment unit 6. The shim adjustment unit 5 and the frequency adjustment unit 6 are components of the magnetic resonance apparatus 1 for automated setting of operational parameters, namely the shim currents and the transmit frequency. If the transmit frequency and the resonant frequency of the spins examined do not match the result is significant signal losses. The determination of the exact resonant frequency thus serves to set the transmit frequency, in this case of the radio-frequency coil 2.

In such cases the transmit frequency can be variably adjustable. For example for fat saturation pulses or fat saturation methods the resonant frequency of fat protons can be the transmit frequency and for the imaging experiment it can be the resonant frequency of water protons.

The described method is implemented in software in the control computer 4, more precisely as the frequency adjustment unit 6. After the positioning of the patient it is performed as a part of the adjustment before beginning the examination measurements.

FIG. 2 shows a first embodiment of the method for determining the resonant frequency as a flowchart. In step S1 a spectrum of the examination area is recorded and in step S2 the number of resonance peaks in the spectrum is determined. Depending on the number of resonance peaks the further method is embodied differently.

If only one peak is present, in step S3 at least one dataset is recorded with the Dixon method, comprising two image datasets which were recorded with different echo times. The two images recorded in this way are added and subtracted to overlay images. From the overlay images, as a function of the echo times used, deductions can then be made about the presence of fat, water or silicon. If no fat is present for example the corresponding overlay image only shows a noise signal or minimal signal components because of residual water signal.

In the case of three peaks, the result is almost already given. The right-most peak in the spectrum is the water peak. Either the frequency of this peak is set as the system frequency as step S4 and the fat and silicon frequency are determined starting from this frequency. As an alternative a model spectrum with three peaks can also be fitted on, wherein at least the signal intensities are to be varied. The three resonant frequencies are then obtained too.

If two peaks are present, there are likewise two alternatives available. In step S5 either the frequency spacing of the peaks can be established and it can then be established on the basis of a set of rules which spin species are present. For example, for a spacing of $\Delta f<2$ ppm, the spin species are fat and silicon.

As an alternative, a normalized cross-correlation coefficient determination with peak pairs water and fat, water and silicon and fat and silicon can be performed. Again, this means that a user input is not required.

FIG. 3 is a flowchart for frequency adjustment with a number of coils. In this case the steps are numbered on the basis of FIG. 2, with higher numbers to distinguish them from FIG. 2. This does not mean, however, that the method in accordance with FIG. 3 is executed after the method in accordance with FIG. 2. Instead the methods are basically independent of one another and can merely be advantageously combined.

Figure 4:
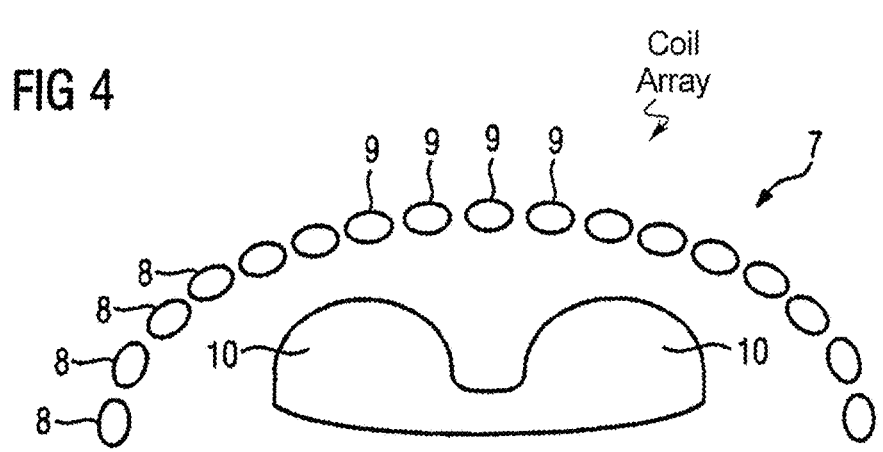
FIG. 4 shows a breast coil array in cross-section.

FIG. 4 shows the coil array used for performing the method in accordance with FIG. 3 in a view from above. Preferably this array involves a breast coil array 7.

In step S6 spectra are recorded with a number, preferably with all, coils of a coil array 7, i.e. signals are acquired and at least Fourier-transformed. Since the location of the coils is known, the spectra can be assigned to specific regions or body areas.

Since the spectra of these coils of a coil array 7 usually embodied as surface coils only record signals from a very restricted volume, the spectra exhibit one or maximum two resonance peaks. This allows conclusions to be drawn depending on the location of the coils.

In step S7, the resonance peaks of the lateral coils 8 of a breast coil array 7 are evaluated as to whether one or two resonance peaks are present. As an alternative or in addition, in step 58 the frequencies of the resonant peaks of the lateral coils 8 are compared with the frequencies of the resonance peaks of the other coils 9, especially coils on the front side. If two peaks are present in the spectra of the lateral coils 8 or if there is a difference between the frequencies of the resonance peaks of the lateral coils 8 and the other coils 9, silicon is present in the breast 10. The steps S7 and/or S8 are thus used for implant detection.

FIG. 5 shows a method for evaluating the spectra recorded in step S6 in addition to or as an alternative to the method in FIG. 3. As an alternative or in addition to the steps S7 and S8, a shifting of the frequencies of the resonance peaks over a number of coils can be determined. For example, a coil can be established as a reference coil in step S9 and on this basis the difference of the frequencies of the resonance peaks can be determined (step S10). Since the location is also known in relation to the respective spectra, it can be established in step S11, preferably using a threshold value, whether the differences indicate local $B_0$ inhomogeneities or a more extensive $B_0$ gradient.

The $B_0$ homogeneity established in this way can optionally be divided into classes in step S12, for example $\Delta f<5$ Hz→class A 5 Hz≤$\Delta f<10$ Hz→class B 10 Hz≤$\Delta f$→class C.

In this classification, either the overall greatest difference occurring, the greatest difference from an average value or any other variable specifying a difference is used as the difference. Depending on the class derived therefrom, there can be further steps S13, e.g. the determination of parameters or the restriction of the determination of settings. Preferably the use of specific radio-frequency pulses, e.g. frequency-selective inversion pulses for a preliminary SPAIR fat suppression experiment, can be restricted as a function of the $B_0$ homogeneity class and only be allowed for classes A or B. As an alternative a repositioning of the patient can be proposed as step S14 and/or there can be re-shimming (step S15). In a further alternative the method described for FIG. 6 can be performed.

FIG. 6 shows an option, as an alternative or in addition to that shown in FIGS. 3 and/or 5, for evaluating the spectra recorded in step S6. In accordance with step S15 the frequencies of the fat resonance peaks are established, for example by taking account of the frequencies of the resonance peaks from specific coils 8 and/or 9. In this case, if two peaks exist, the right-most or left-most peak can always be used, depending on whether the second peak is determined as a water peak or a silicon peak. With the lateral coils 8 a fat peak, i.e. a resonance peak at the frequency characteristic for fat, can be expected or two peaks if a silicon-containing implant is present. This can also depend on the location of the respective coil. In step S16, on the basis of the least one part of the established fat resonant frequencies using a statistical code, the fat resonance frequency in the sense of a system fat frequency or fat transmission frequency is determined. The statistical code is preferably the average value of the smallest and the largest fat resonant frequency. As an alternative the average value of all fat resonant frequencies can be used.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A method for automated establishment of at least one resonant frequency in a magnetic resonance (MR) scanner, comprising:

from a control computer, operating an MR scanner to acquire at least one MR signal from protons in a subject situated in the MR scanner;

in said control computer, Fourier transforming said MR signal to obtain a spectrum;

in said control computer, identifying resonant peaks in said spectrum;

in said control computer, counting a number of said resonant peaks in said spectrum in order to identify a numerical value of said number of resonant peaks in said spectrum;

in said control computer, determining at least one resonant frequency dependent on said numerical value of said number of resonant peaks;

from said control computer, generating and emitting an electronic signal said MR scanner to operate at said at least one resonant frequency in order to excite nuclear spins in said protons in said subject at said at least one resonant frequency and thereby obtaining further MR signals resulting from the nuclear spins having been excited at said at least one resonant frequency; and in said control computer, reconstructing image data from said further MR signals, said image data representing selected protons that corresponds to the selected nuclear spins, and displaying said image data at a display as an MR image of the subject.

2. A method as claimed in claim 1 wherein said numerical value of said number of peaks is one, and comprising, from said control unit, operating said MR scanner with said electronic signal to acquire MR signals at said resonant frequency in at least one data set of a Dixon method.

3. A method as claimed in claim 1 wherein said numerical value of said number of resonant peaks is two, and comprising determining said at least one resonant frequency by accessing, from a database, model spectra each having two resonant peaks and at least three different frequency spacings, and calculating cross-correlation coefficients of said model spectra, and determining said at least one resonant frequency from said cross-correlation coefficients.

4. A method as claimed in claim 1 wherein said numerical value of said number of resonant peaks is two, and comprising, in said control computer, determining a frequency spacing of said two resonant peaks and determining said at least one resonant frequency dependent on said frequency spacing.

5. A method as claimed in claim 1 wherein said MR scanner comprises a coil array comprising at least two coils, each of said at least two coils occupying a location in said scanner relative to said subject, and comprising operating said MR scanner with said electronic signal to excite nuclear spins in the subject at said at least one resonant frequency, and detecting MR signals from the subject with said at least two coils, and comparing respective resonant frequencies of the detected signals, dependent on the respective positions of said at least two coils, to obtain a comparison result, and using said comparison result to determine a state parameter of said subject.

6. A method as claimed in claim 5 comprising determining, as said state parameter, an identification of a presence or an absence of a silicon-containing implant.

7. A method as claimed in claim 5 comprising determining, as said state parameter, homogeneity of a basic magnetic field in the subject, generated by said MR scanner.

8. A method as claimed in claim 7 comprising, in said control computer, determining parameters for operating said MR scanner dependent on said homogeneity.

9. A method as claimed in claim 8 comprising determining parameters for radio-frequency pulses, from which said energy at said resonant frequency is emitted, in said MR scanner, deponent on said homogeneity.

10. A method as claimed in claim 1 wherein said MR scanner comprises a coil array comprising at least two coils and, from said control computer, operating said MR scanner to acquire at least two MR signals respectively with said at least two coils after excitation of nuclear spins using said electronic signal.

11. A method as claimed in claim 10 comprising determining a transmit frequency for said at least two coils from said at least one resonant frequency using a statistical code.

12. A method as claimed in claim 1 comprising acquiring said at least one MR signal as an FID signal.

13. A magnetic resonance (MR) apparatus comprising: an MR scanner;

a control computer configured to operate said MR scanner to acquire at least one MR signal from a subject situated in the MR scanner; said control computer being configured to Fourier transform said MR signal to obtain a spectrum;

said control computer being configured to resonant peaks in said spectrum; said control computer being configured to count a number of said resonant peaks in said spectrum in order to identify a numerical value of said number of resonant peaks in said spectrum;

said control computer being configured to determine at least one resonant frequency dependent on said numerical value of said number of resonant peaks;

said control computer being configured to generate and emit an electronic signal that sets said MR scanner to operate at said at least one resonant frequency and to operate said MR scanner with said electronic signal by exciting nuclear spins in protons in said subject at said at least one resonant frequency and thereby obtain further MR signals resulting from the nuclear spins having been excited at said at least one resonant frequency: said control computer being configured to reconstruct image data from said further MR signals, said image data representing selected protons that corresponds to the selected nuclear spins, and to display said image data at said display as an MR image of the subject.

* * * * *